United States Patent
Hartley et al.

(10) Patent No.: US 12,352,804 B1
(45) Date of Patent: Jul. 8, 2025

(54) ADDITIVELY MANUFACTURED PRINTED ELECTRONICS TESTER

(71) Applicant: Honeywell Federal Manufacturing & Technologies, LLC, Kansas City, MO (US)

(72) Inventors: Daniel Benjamin Hartley, Holden, MO (US); Jaime Eduardo Regis, Overland Park, KS (US); Ryan John Eickbush, Lee+3 s Summit, MO (US); Bill Capen, Raymore, MO (US); Jason Bradley Edgar, Potosi, MO (US)

(73) Assignee: Honeywell Federal Manufacturing & Technologies, LLC, Kansas City, MO (US)

( * ) Notice: Subject to any disclaimer, the term of this patent is extended or adjusted under 35 U.S.C. 154(b) by 0 days.

(21) Appl. No.: 18/787,537

(22) Filed: Jul. 29, 2024

(51) Int. Cl.
| | |
|---|---|
| *B33Y 80/00* | (2015.01) |
| *B33Y 10/00* | (2015.01) |
| *G01R 31/28* | (2006.01) |
| *H05K 1/02* | (2006.01) |

(52) U.S. Cl.
CPC .......... *G01R 31/2818* (2013.01); *B33Y 10/00* (2014.12); *B33Y 80/00* (2014.12); *H05K 1/0268* (2013.01)

(58) Field of Classification Search
CPC .... G01R 31/2818; B33Y 10/00; B33Y 80/00; H05K 1/0268
See application file for complete search history.

(56) References Cited

U.S. PATENT DOCUMENTS

| | | | | |
|---|---|---|---|---|
| 4,706,167 A | * | 11/1987 | Sullivan | H05K 1/0266 361/779 |
| 6,606,252 B1 | * | 8/2003 | Snider | H05K 1/0268 174/262 |
| 7,149,089 B2 | * | 12/2006 | Blasko | H01R 13/521 361/752 |
| 2003/0179005 A1 | * | 9/2003 | Buczkowski | G01R 1/07378 324/750.26 |
| 2004/0118603 A1 | * | 6/2004 | Chambers | H04L 7/0037 174/261 |
| 2007/0241165 A1 | * | 10/2007 | Deram | B23K 1/203 228/101 |
| 2017/0156658 A1 | * | 6/2017 | Maharbiz | A61B 5/053 |
| 2019/0265289 A1 | * | 8/2019 | Böhler | G01R 31/68 |
| 2022/0377882 A1 | | 11/2022 | Diamond | |
| 2022/0377888 A1 | | 11/2022 | Diamond | |

* cited by examiner

*Primary Examiner* — Huy Q Phan
*Assistant Examiner* — Haidong Zhang
(74) *Attorney, Agent, or Firm* — Erise IP, P.A.

(57) ABSTRACT

Systems and methods for testing platforms using additive manufacturing techniques. A testing platform may include an electrical device configured to maintain an electrical connection with one or more additional electrical devices. A testing platform may include one or more connection pads configured to establish a secondary electrical connection between the electrical device and an external testing system. A testing platform may include a testing pattern usable by the external testing system, the testing pattern comprising: one or more printed traces, the one or more printed traces formed from a material deposited via an additive manufacturing technique, wherein the one or more printed traces are located between the electrical device and the one or more additional electrical devices.

20 Claims, 9 Drawing Sheets

ADDITIVELY MANUFACTURED PRINTED ELECTRONICS TESTER

STATEMENT OF GOVERNMENT SUPPORT

This invention was made with government support under contract number DE-NA-0002839 awarded by the United States Department of Energy/National Nuclear Security Administration. The government has certain rights in the invention.

BACKGROUND

1. Field

Embodiments of the present disclosure relate to electronics testing. More specifically, embodiments of the present disclosure relate to additively manufactured printed electronics testing.

2. Related Art

When manufacturing electronics, printed circuit boards (PCBs), and/or printed wiring boards (PWBs), it is often necessary to perform a series of tests to determine the part's cleanliness, connectivity, withstandability under various environmental conditions, and other characteristics of the part. For example, printed circuit assembly (PCA) manufacturers often perform surface-insulation resistance (SIR) testing to determine the overall cleanliness and structural condition of the board, which may require specific software, machines, and conductive elements, such as a damp-heat test chamber. Traditionally, this type of testing has been done using custom-printed boards. Custom printed wiring and/or circuit boards may be designed with patterns integrated under the components to be tested.

Custom-printed testing boards are often expensive and may have a long lead time on design and manufacturing. Additionally, manufacturers are often limited in their testing capabilities, due to their static design. Further, these boards may be unable to test actual components, instead running tests on components that are for testing purposes only and may differ slightly from actual components. As such, there is a desire for systems and methods that alleviate one or more of the concerns of current testing configurations.

SUMMARY

In some aspects, the techniques described herein relate to a testing platform including: an electrical device configured to maintain an electrical connection with one or more additional electrical devices; one or more connection pads configured to establish a secondary electrical connection between the electrical device and an external testing system; and a testing pattern usable by the external testing system, the testing pattern including: one or more printed traces, the one or more printed traces formed from a material deposited via an additive manufacturing technique, wherein the one or more printed traces are located between the electrical device and the one or more additional electrical devices.

In some aspects, the techniques described herein relate to a testing platform, wherein the testing pattern includes a SIR testing pattern and the external testing system is configured to perform a SIR test.

In some aspects, the techniques described herein relate to a testing platform, wherein the one or more additional electrical devices includes at least one of a printed circuit board, a printed circuit assembly, or a printed wiring board.

In some aspects, the techniques described herein relate to a testing platform, wherein the electrical device includes at least one of a ball grid array, a quad flat no-lead package, or a bottom-terminated component.

In some aspects, the techniques described herein relate to a testing platform, further including: an electrical device adapter, wherein the electrical device adapter is configured to lock the external testing system to the one or more connection pads to maintain the secondary electrical connection.

In some aspects, the techniques described herein relate to a testing platform, wherein the testing pattern includes a printed sensor, the printed sensor configured to measure one or more characteristics of the electrical device.

In some aspects, the techniques described herein relate to a testing platform, wherein the additive manufacturing technique includes an aerosol jet printing system.

In some aspects, the techniques described herein relate to a method for creating testing platforms via additive manufacturing, including: determining a testing pattern for a plurality of electrical devices electrically coupled together, the testing pattern including: one or more printed traces, the one or more printed traces formed from a material; and depositing, via an additive manufacturing technique, the testing pattern on at least an electrical device from the plurality of electrical devices, the electrical device including: one or more connection pads configured to establish an electrical connection between the electrical device and an external testing system, wherein the one or more printed traces are located between the plurality of electrical devices.

In some aspects, the techniques described herein relate to a method, further including: depositing, on an underside of the electrical device, the one or more printed traces such that the one or more printed traces form the testing pattern.

In some aspects, the techniques described herein relate to a method, wherein the testing pattern is an SIR testing pattern usable by the external testing system to perform SIR testing.

In some aspects, the techniques described herein relate to a method, further including: depositing the one or more connection pads on a topside of the electrical device such that the electrical connection between the electrical device and the external testing system can be established from the topside of the electrical device.

In some aspects, the techniques described herein relate to a method, wherein the testing pattern is formed from an ink deposited by the additive manufacturing technique.

In some aspects, the techniques described herein relate to a method, further including: securing the electrical device to the external testing system via an electrical device adapter.

In some aspects, the techniques described herein relate to a method, wherein securing the electrical device to the external testing system via the electrical device adapter includes: placing one or more leads from the external testing system in one or more lead cutouts of the electrical device adapter such that the one or more leads touch the one or more connection pads on the electrical device.

In some aspects, the techniques described herein relate to a testing platform, including: an electrical device including: one or more connection pads configured to establish an electrical connection between the electrical device and an external testing system; a testing pattern deposited on the electrical device and usable by the external testing system, the testing pattern including: one or more printed traces, the one or more printed traces formed from a material deposited via an additive manufacturing technique; and an electrical device adapter, wherein the electrical device adapter is configured to secure the external testing system to the one or more connection pads to maintain the electrical connection.

In some aspects, the techniques described herein relate to a testing platform, wherein the material includes a deposition of nanoparticles.

In some aspects, the techniques described herein relate to a testing platform, wherein the electrical device adapter is configured to secure the external testing system to the one or more connection pads such that one or more leads of the external testing system maintain the electrical connection with the one or more connection pads.

In some aspects, the techniques described herein relate to a testing platform, wherein the one or more connection pads wrap around to a topside of the electrical device such that the one or more leads establish the electrical connection with the one or more connection pads on the topside of the electrical device.

In some aspects, the techniques described herein relate to a testing platform, wherein the electrical device adapter includes: a plurality of tabs configured to secure and release the electrical device to the electrical device adapter.

In some aspects, the techniques described herein relate to a testing platform, wherein the testing pattern is deposited on an underside of the electrical device.

This summary is provided to introduce a selection of concepts in a simplified form that are further described below in the detailed description. This summary is not intended to identify key features or essential features of the claimed subject matter, nor is it intended to be used to limit the scope of the claimed subject matter. Other aspects and advantages of the present disclosure will be apparent from the following detailed description of the embodiments and the accompanying drawing figures.

BRIEF DESCRIPTION OF THE DRAWING FIGURES

Embodiments of the present disclosure are described in detail below with reference to the attached drawing figures, wherein.

Figure 1A:
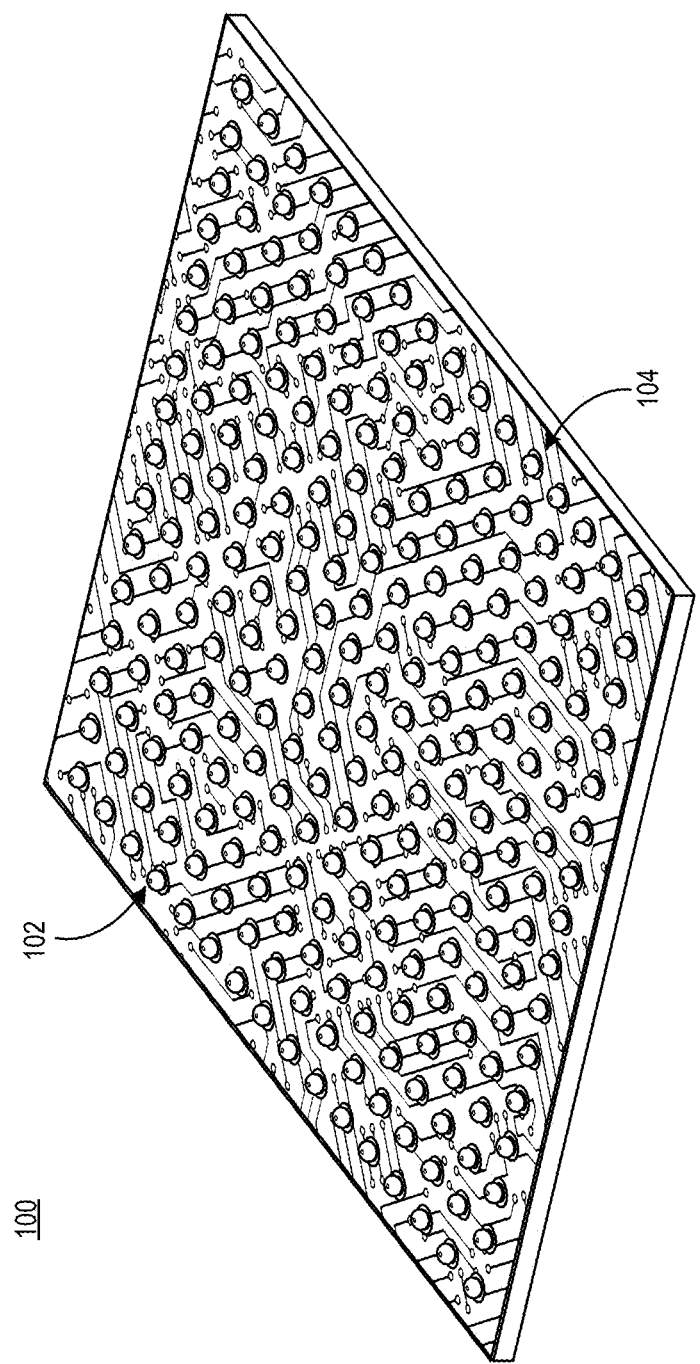
FIG. 1A depicts an exemplary electrical device in accordance with embodiments of the invention.

The drawing figures do not limit the present disclosure to the specific embodiments disclosed and described herein.

The drawings are not necessarily to scale, emphasis instead being placed upon clearly illustrating the principles of the present disclosure.

DETAILED DESCRIPTION

The following detailed description references the accompanying drawings that illustrate specific embodiments in which the present disclosure can be practiced. The embodiments are intended to describe aspects of the present disclosure in sufficient detail to enable those skilled in the art to practice the present disclosure. Other embodiments can be utilized and changes can be made without departing from the scope of the present disclosure. The following detailed description is, therefore, not to be taken in a limiting sense. The scope of the present disclosure is defined only by the appended claims, along with the full scope of equivalents to which such claims are entitled.

In this description, references to "one embodiment," "an embodiment," or "embodiments" mean that the feature or features being referred to are included in at least one embodiment of the technology. Separate references to "one embodiment," "an embodiment," or "embodiments" in this description do not necessarily refer to the same embodiment and are also not mutually exclusive unless so stated and/or except as will be readily apparent to those skilled in the art from the description. For example, a feature, structure, act, etc. described in one embodiment may also be included in other embodiments, but is not necessarily included. Thus, the technology can include a variety of combinations and/or integrations of the embodiments described herein.

Generally, embodiments of the present disclosure relate to systems and methods for performing a series of tests using additively manufactured printing patterns on components. In some embodiments, an electrical device may include one or more leads and one or more traces, where one or more testing traces are deposited between the one or more leads. The one or more testing traces may be additively deposited on the platform and may form a testing pattern. The testing pattern may be used by external testing devices to perform a series of tests on the electrical device and/or an assembly containing the electrical device, for example to test structural integrity, cleanliness, and other characteristics. A testing device interface may connect the electrical device to an external testing device.

The testing device interface may connect to the electrical device using an adapter, where the adapter secures the electrical device in place such that one or more leads of the testing device interface connect with one or more pads of the electrical device to establish an electrical connection. In some environments, the adapter may include one or more flaps to manipulate one or more clips. When the one or more flaps are squeezed toward each other, the distance between the ends of the one or more clips may widen, allowing for the electrical device to be placed in a bottom cavity of the adapter. The one or more flaps may then be released by a user, which may result in the one or more clips gripping the edges of the electrical device to secure the board in the bottom cavity.

Figure 1B:
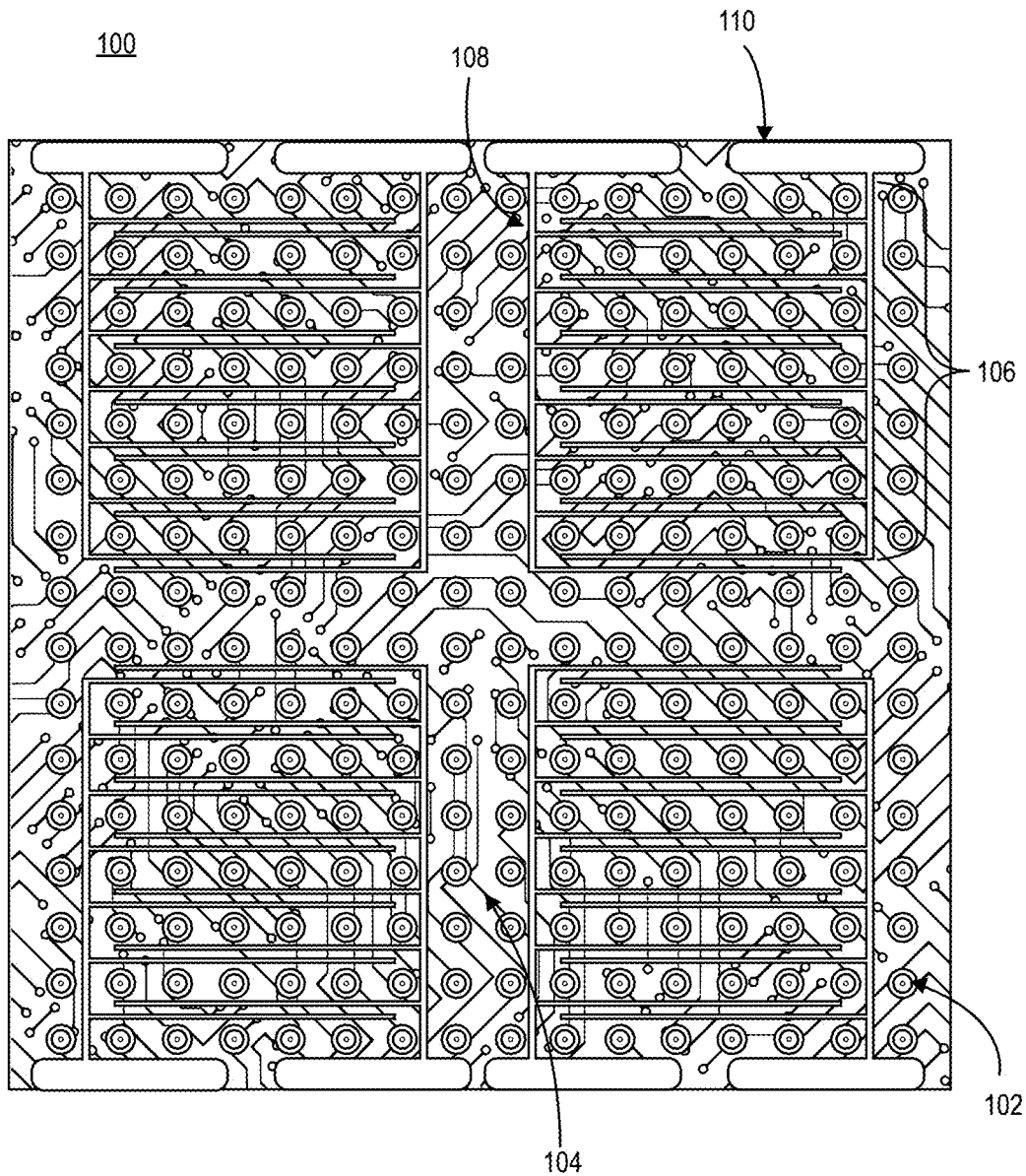
FIG. 1B depicts an exemplary testing platform in accordance with embodiments of the invention.

To begin, FIGS. 1A-1B illustrate exemplary electrical devices relating to some embodiments of the present disclosure. Electrical device 100 may be any suitable product (e.g., component, board, etc.) now known or later developed, including, but not limited to, a PCB, a PWB, a PCA, an integrated circuit (IC), a quad flat no-lead package (QFN), a commercial off-the-shelf (COTS) component, a bottom terminated component (BTC), a small outline integrated circuit (SOIC), a discrete component, a non-circuit board case, and any other device. For example, electrical device 100 may be a ball grid array (BGA) component.

Accordingly, as depicted in FIG. 1A, the BGA may include an array of solder balls extending from one or more leads 102, where the total size of the BGA is less than or equal to 17 mm and the total distance between adjacent pairs of one or more leads 102 is 500 µm. In some embodiments, a length of a side of electrical device 100 is approximately 17 mm. In other embodiments, a length of a side of electrical device 100 is between 15-19 mm. In still other embodiments, a length of a side of electrical device 100 is between 5-32 mm. It is noted herein that electrical device 100 may be any suitable size, shape, or material now known or later developed, such as a square PCB made of copper, resin, and glass.

Electrical device 100 may contain one or more leads 102 connecting one or more components to electrical device 100 and/or to additional components on electrical device 100 through one or more electrical traces 104. The one or more leads 102 may form a leaded area on the underside of electrical device 100. In some embodiments, one or more leads 102 may be spaced at a distance of approximately 500 µm. In other embodiments, one or more leads 102 may be spaced at a distance between 400 µm and 600 µm. In still other embodiments, one or more leads 102 may be spaced at a distance between 250 µm and 750 µm. It is noted herein that one or more leads 102 may be spaced at a distance of any size without departing from the scope of the invention.

At a high level, electrical device 100 may be configured for testing such as to form a testing platform. Specifically, electrical device 100 may include elements to be used to test electrical device 100, such as elements to interface with a tester (like external testing device 302, discussed below). In some embodiments, electrical device 100 may include testing pattern 106. Generally, testing pattern 106 may be designed to aid in various tests performed on electrical device 100. Testing pattern 106 may be designed and deposited so as not to affect and/or change the pre-existing functionality and electrical integrity of electrical device 100, an assembly containing electrical device 100, or any other components of a system containing electrical device 100.

Testing pattern 106 may be a sensor deposited for a general or specific purpose, such as a temperature sensor, humidity sensor, pressure sensor, thermocouple, strain gauge, capacitive sensor, and the like. Testing pattern 106 may be a specific pattern utilized by additional testing equipment to perform tests. Examples of tests that may be run using electrical device 100 with testing pattern 106 are described further below with respect to FIG. 3. It is noted herein that electrical device 100 may contain one or more patterns in addition to testing pattern 106. For example, as depicted in FIG. 1A, electrical device 100 may contain three additional duplicate patterns along with testing pattern 106.

In some embodiments, testing pattern 106 may be formed from one or more printed traces 108. As mentioned above, one or more printed traces 108 may interface with additional testing equipment to run a series of tests. For example, as described further below, the one or more printed traces 108 may utilized for SIR testing. Generally, one or more printed traces 108 may be substantially similar to the traces and or components that may be found on traditional custom-printed testing boards. In some embodiments, testing pattern 106 and/or one or more printed traces 108 forming testing pattern 106 may be located on the topside, underside, sides, or any other location of electrical device 100. In some embodiments, one or more printed traces 108 may run between one or more leads 102 of electrical device 100. For example, one or more printed traces 108 may run between various rows and/or columns of the underside of a BGA. Accordingly, one or more printed traces 108 may be deposited in a space approximately 500 µm wide.

One or more printed traces 108 may be formed from any material now known or later developed, including, but not limited to, various types of inks and non-ink materials. For example, one or more printed traces 108 may be formed from an ink including conductive particles suspended in a solvent. In other embodiments, the ink used for one or more printed traces 108 may be formed from a non-conductive material, such as a plastic-based or polymer-based material. In some embodiments, one or more printed traces 108 may be formed from an ink made from a metallic material. For example, the ink used to make one or more printed traces 108 may be formed from silver particles, copper particles, a combination of silver and copper particles, or any other metallic particles. In other embodiments, one or more printed traces 108 may be formed from a nonmetallic material. For example, the ink may contain graphite particles suspended in the solvent. For another example, the ink may be a dielectric ink. In some embodiments, one or more printed traces 108 may be formed by depositing nanoparticles on electrical device 100, followed by laser sintering.

Testing pattern 106 may be deposited on electrical device 100 using additive manufacturing. For example, testing pattern 106 may be deposited on electrical device 100 using aerosol jet printing. Any additive manufacturing printing system technique now known or later developed may be used to deposit testing pattern 106 onto electrical device 100, including, but not limited to, aerosol jet printing systems, 3-dimensional printing systems, inkjet systems, droplet-based systems, extrusion-based deposition systems, laser-based systems, tip-based deposition systems, additive manufacturing systems, and similar manufacturing systems. By depositing testing pattern 106 directly on electrical device 100 via additive manufacturing, the use of a dedicated testing board may no longer be required. Additionally, by depositing testing pattern 106 directly on an electrical device, it may allow tests to be run directly on the electrical device which may then be utilized for additional purposes, rather than using an electrical device for testing purposes only.

In some embodiments, electrical device 100 may include one or more connection pads 110. Generally, one or more connection pads 110 may be conductive pads that allow external devices to make electrical contact with electrical device 100 and/or various components of electrical device 100. Put another way, one or more connection pads 110 may serve as an electrical connection interface between electrical device 100 and external devices For example, one or more connection pads 110 may be coupled to one or more printed traces 108 such that external devices may be coupled to one or more printed traces 108 through one or more connection pads 110, as discussed further below. One or more connection pads 110 may be formed from any material now known or later developed including, but not limited to, silver, copper, and other metals. One or more connection pads 110 may be any structure for facilitating electrical contact, such as faces, pogo pins, and the like.

In some embodiments, the one or more connection pads 110 may wrap around electrical device 100 such that electrical device 100 may make electrical connection with external devices (such as testing device interface 304 depicted in FIG. 3) from the top side of electrical device 100. In other embodiments, one or more connection pads 110 are located solely on the underside of electrical device 100 (as depicted in FIG. 1A). In still other embodiments, one or more connection pads 110 both wrap around to the top side of electrical device 100 and are located on the underside of electrical device 100. It is noted herein that one or more connection pads 110 may be located on any side of electrical device 100 such that a connection can be established on any side of electrical device 100.

Figure 2A:
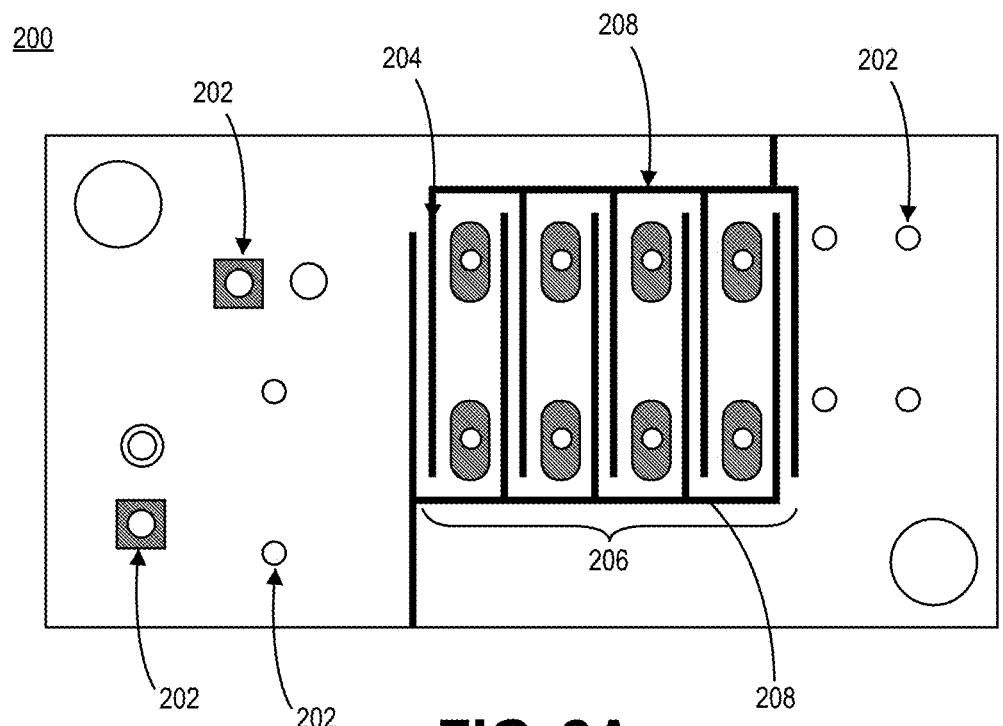
FIG. 2A depicts an exemplary electrical device in accordance with embodiments of the invention.
Figure 2B:
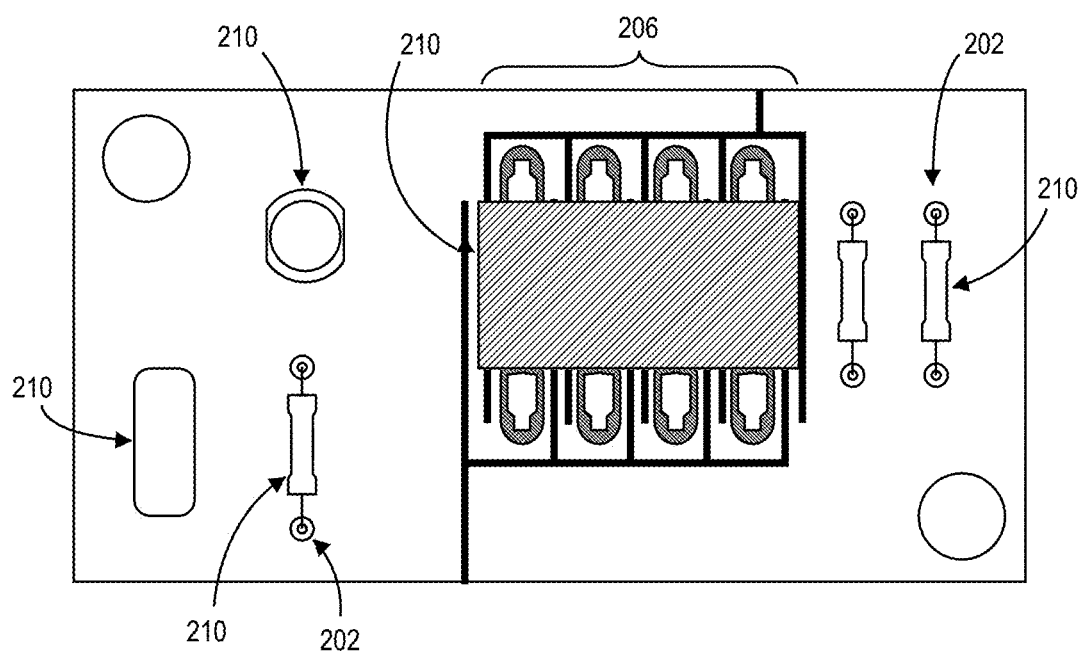
FIG. 2B depicts an exemplary testing platform in accordance with embodiments of the invention.

Continuing on, FIGS. 2A-2B depict exemplary electrical devices in accordance with embodiments of the invention. Broadly, as described above, electrical device 200, generally corresponding to electrical device 100 depicted in FIGS. 1A-1B, may be an assembly and/or device including one or more electrical connections between components and electrical device 100 components located on electrical device 100. For example, electrical device 200 may be a PCB, a PWA, a PCA, or any other electrical device.

Electrical device 200 may include one or more leads 202, generally corresponding to one or more leads 102 depicted in FIG. 2. One or more leads 202 may be configured to receive one or more components 210. One or more components 210 may be any components now known or later developed, including, but not limited to LEDs, sensors, additional electrical devices (such as electrical device 100), resistors, interfaces, ICs, and any other devices. Electrical device 200 may include one or more traces establishing electrical connection interfaces between electrical device 200, one or more components 210, and/or external devices.

In a substantially similar fashion to electrical device 100 in FIGS. 1A-1B, electrical device 200 may be configured for testing. In some embodiments, electrical device 200 may include testing pattern 206, generally corresponding to testing pattern 106 depicted in FIG. 1. As stated above, testing pattern 206 may be used to run any number of tests on electrical device 200 and/or one or more components 210. For example, as depicted in FIG. 2A, testing pattern 206 may be deposited on electrical device 200 such that testing pattern 206 may be used to test the cleanliness of one or more leads 202.

In some embodiments, electrical device 200 may include one or more printed traces 208, generally corresponding to one or more printed traces 108 depicted in FIG. 1. One or more printed traces 208 may be deposited using any additive manufacturing technique. For example, one or more printed traces 208 may be deposited using an aerosol jet system. One or more printed traces 208 may be any material now known or later developed, including a conductive ink, dielectric ink, and nanoparticles.

In some embodiments, testing pattern 206 may be deposited on electrical device 200 such that one or more components 210 may rest above and/or on top of testing pattern 206 when one or more components 210 are placed on electrical device 200. For example, as depicted in FIG. 2B., one or more components 210 (such as an IC) may be placed on electrical device 200 where testing pattern 206 rests on electrical device 200 below one or more components 210. Accordingly, testing pattern 206 may remain on electrical device 200 while electrical device 200 is functional for additional purposes, allowing tests to be run on electrical device 200 and one or more components 210 at any time during the lifespan of electrical device 200. This may prove useful for running real-time tests to determine the wear of electrical device 200 as it is used, such as when it is used in an additional product.

Figure 3:
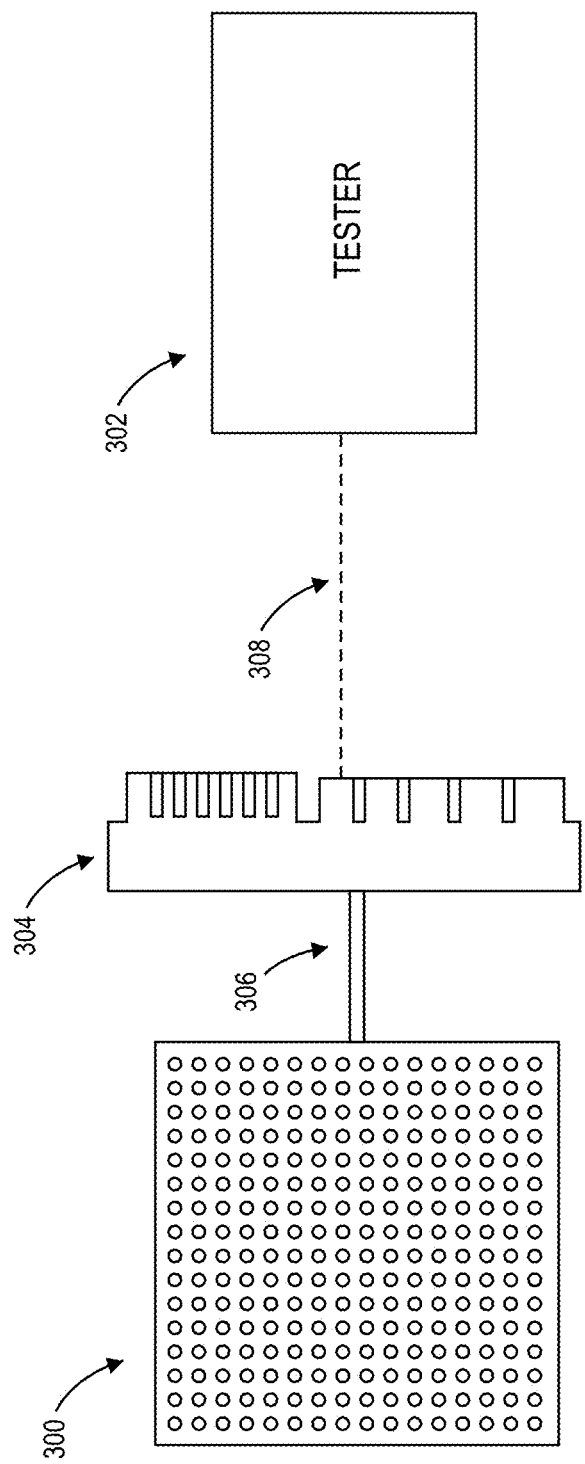
FIG. 3 depicts an exemplary block diagram with the testing platform in accordance with embodiments of the invention.

Continuing on, FIG. 3 depicts an exemplary block diagram of a testing platform in accordance with embodiments of the invention. Electrical device 300 may generally correspond to electrical device 100 and electrical device 200 depicted in FIGS. 1A-2B and may include all elements described with regard to electrical device 100 and electrical device 200. For example, electrical device 300 may include one or more leads, one or more board traces, one or more testing patterns, and one or more connection pads. Electrical device 300 may be any device now known or later developed, including, but not limited to, a PCB, a PWB, a component on a PCB/PWB, and the like. For example, electrical device 300 may be a component, such as a ball grid array.

At a high level, electrical device 300 may be coupled to external testing device 302, which may be configured to perform any number of tests on electrical device 300 using the testing patterns deposited on electrical device 300. In some embodiments, external testing device 302 may be configured to perform SIR testing, where the electrical resistance between conductors on electrical device 300 is measured under specific conditions. In some embodiments, external testing device 302 may be configured to perform electrochemical migration (ECM) testing to test the integrity of the connections as it relates to materials used and the cleanliness of electrical device 300.

In some embodiments, external testing device 302 may include a computer system or any other form factor of general- or special-purpose computing device. External testing device 302 may contain any number and form of processing unit, such as a CPU. Additionally, external testing device 302 may include non-transitory computer-readable media including, but not limited to, random-access memory and read-only memory.

In order to couple electrical device 300 to external testing device 302, testing device interface 304 may be employed. In some embodiments, electrical device 300 may be configured to establish a connection with testing device interface 304 using electrical device adapter 306. In some embodiments, the connection between electrical device 300 and testing device interface 304 is an electrical connection. For example, an electrical connection may be established between one or more connection pads located on electrical device 300 and one or more electrical leads connected to testing device interface 304, as described more below with respect to FIGS. 5A-5B.

In some embodiments, testing device interface 304 may be configured to connect with external testing device 302. For example, testing device interface 304 may include one or more conductive leads/teeth corresponding to a slot on external testing device 302 such that testing device interface 304 may slot into external testing device 302 and establish an electrical connection. In some embodiments, testing device interface 304 provides an electrical connection between electrical device 300 and external testing device 302, allowing external testing device 302 to measure electrical resistivity or conductivity between pairs of leads on electrical device 300. In other embodiments, testing device interface 304 may facilitate data transfer between electrical device 300 and external testing device 302. For example, pairwise conductivity or resistivity values between any pairs of leads may be measured by electrical device 300 and communicated between electrical device 300 and external testing device 302.

As mentioned, in some embodiments, testing device interface 304 may couple to electrical device 300 via electrical device adapter 306. At a high level, electrical device adapter 306 may be a clip-like component for securing and maintaining an electrical connection between electrical device 300 and testing device interface 304. For example, electrical device adapter 306 may establish a connection between one or more leads of testing device interface 304 and the one or more connection pads of electrical device 300. Electrical device adapter 306 is described further below as it relates to adapter 400 depicted in FIG. 4A and adapter 500 depicted in FIG. 5A.

Figure 4A:
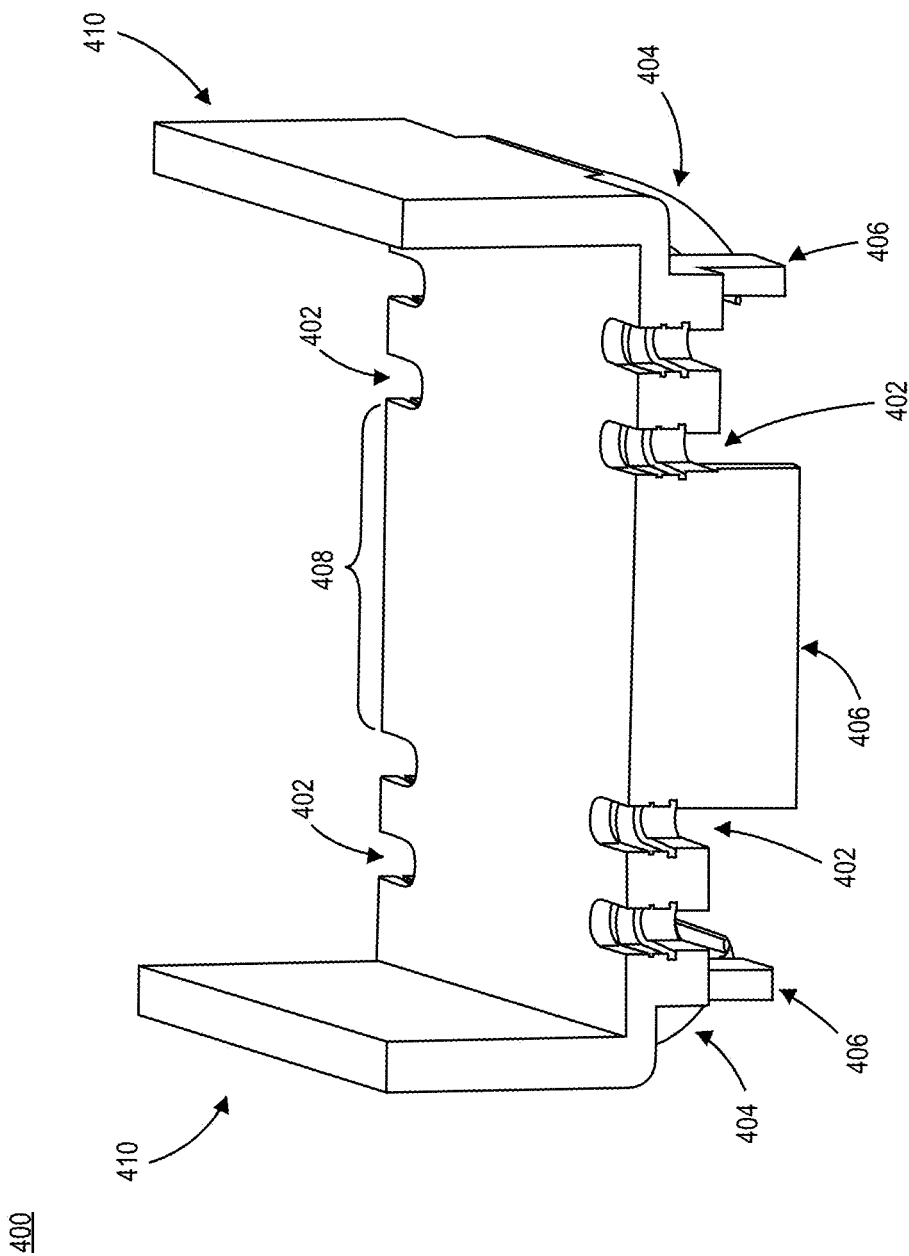
FIG. 4A depicts an exemplary testing platform adapter in accordance with embodiments of the invention.

Continuing on, an exemplary testing board adapter is depicted in FIG. 4A and generally referred to by reference numeral 400. Adapter 400 may be formed from any suitable material now known or later developed, including, but not limited to, rubber, plastic, a polymer-based material, glass, and any other material.

At a high level, adapter 400 may be configured to secure an electrical device (such as electrical device 100, electrical device 200, and electrical device 300) to the bottom cavity (generally related to and described further below with respect to bottom cavity 508 in FIGS. 5A-5B) of adapter 400 such that leads of a testing device interface that are secured to adapter 400 may establish a secure electrical connection to the electrical device. As such, in some embodiments, adapter 400, generally corresponding to electrical device adapter 306 depicted in FIG. 3, may include one or more lead cutouts 402. As described more below with regard to FIGS. 5A-5B, one or more lead cutouts 402 may accommodate a series of electrical leads from a testing device interface, such as testing device interface 304 depicted above in FIG. 3.

In some embodiments, adapter 400 may include one or more clips 404. The ends of one or more clips 404 may be located on the underside of adapter 400. The ends of one or more clips 404 may curve inward towards the center point of adapter 400. In such embodiments, when an electrical device is secured to adapter 400, one or more clips 404 may be positioned such that the ends of one or more clips 404 overlap the edges of the electrical device, holding the electrical device in the bottom cavity of adapter 400.

In some embodiments, adapter 400 may include one or more support structures 406. The one or more support structures 406 may provide additional structural support to an electrical device secured to the bottom cavity of adapter 400. For example, one or more support structures 406 may prevent an electrical device from rotating relative to adapter 400. In some embodiments, one or more support structures 406 along with one or more clips 404 may create the structure for a bottom cavity such as bottom cavity 508 depicted in FIG. 5A. The bottom cavity may create a space for receiving an electrical device and securing the electrical device to adapter 400.

Broadly, adapter 400 may contain one or more mechanisms to secure (e.g., lock) an electrical device to adapter 400 and subsequently release the electrical device from its secured position against adapter 400. In some embodiments, adapter 400 may include one or more tabs 410 protruding upwards relative to one or more clips 404. One or more tabs 410 may attach to one or more clips 404, where physical manipulation of one or more tabs 410 may cause one or more clips 404 to move.

More specifically, in some embodiments, the one or more clips 404 may have a rest position and an active position. For example, the one or more clips 404 may be in an active position when one or more tabs 410 are squeezed toward each other, and when, consequently, one or more clips 404 may extend away from each other. As such, one or more clips 404 may be in a rest position when one or more tabs 410 are not being manipulated toward one another, such as when one or more tabs 410 are released by a user. Accordingly, the electrical device may be secured to adapter 400 when the electrical device is located in the bottom cavity while one or more clips 404 are in a rest position such that the ends of one or more clips 404 extend over the underside of the electrical device. From this position, the electrical device may be released by squeezing one or more tabs 410 toward one another to cause one or more clips 404 to move a distance away from one another to create a space for the electrical device to be removed.

Figure 4B:
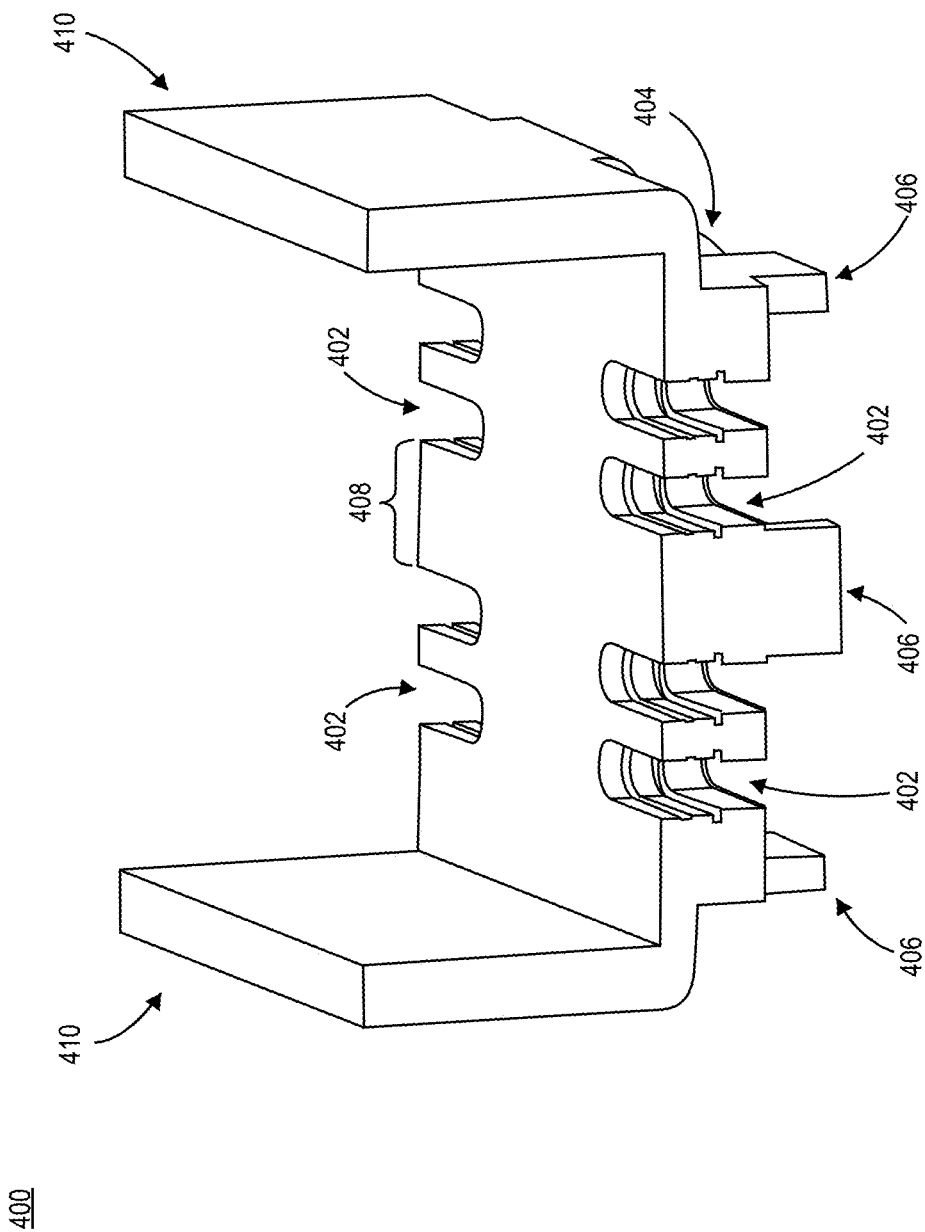
FIG. 4B depicts an exemplary testing platform adapter in accordance with embodiments of the invention.

Generally, adapter 400 may be adjustable to accommodate a variety of electrical devices, such as electrical devices of varying sizes, shapes, dimensions, weights, and materials. For example, as illustrated in FIGS. 4A-4B, distance 408a may be longer relative to distance 408b. Accordingly, the spacing between pairs of the one or more lead cutouts 402 may vary between adapter 400, depicted in FIG. 4A, and adapter 400, depicted in FIG. 4B, which may accommodate electrical devices with differing spacing distances between connection pads. It is noted herein that this is just a single example of a way in which adapter 400 may be adjustable, and other adjustment mechanisms are contemplated, such as varying flexibility of one or more clips 404 and sizes/positions of one or more support structures 406.

Figure 5A:
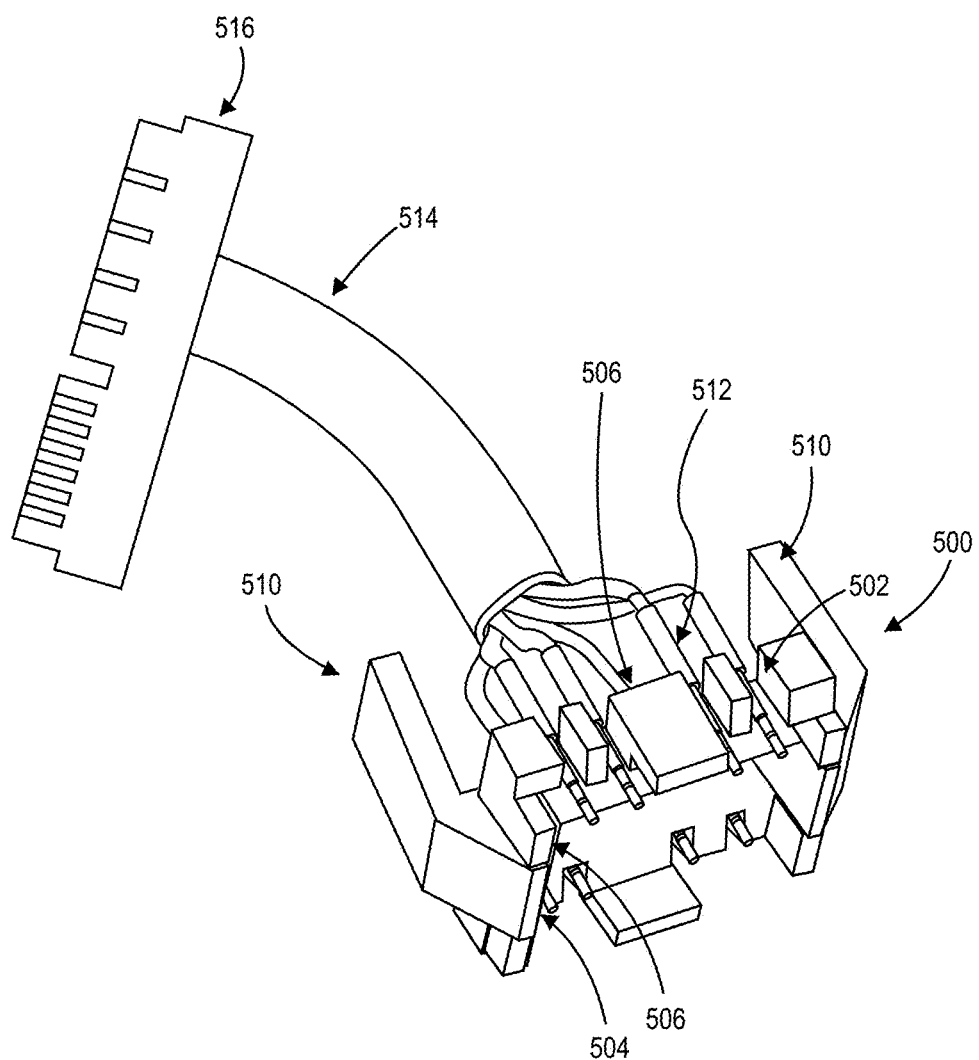
FIG. 5A depicts an exemplary testing platform adapter in accordance with embodiments of the invention.

Continuing on, an exemplary testing board adapter with an attached testing device interface is depicted in FIG. 5A. In a substantially similar fashion to adapter 400 depicted in FIGS. 4A and 4B, adapter 500 may include one or more lead cutouts 502, one or more clips 504, one or more support structures 506, bottom cavity 508, and one or more tabs 510.

As mentioned above, in some embodiments, adapter 500 may include a bottom cavity 508. The bottom cavity 508 may be formed from one or more clips 504 and one or more support structures 506. Generally, bottom cavity 508 may be of adequate size and shape to fit the intended electrical device. As described above, adapter 500 may be adjustable such that bottom cavity 508 can accommodate a range of dimensions of electrical devices. Accordingly, the component may rest in bottom cavity 508 when secured to adapter 500.

As discussed above, in some embodiments, one or more lead cutouts 502 may provide a space for one or more leads 512 attached to testing device interface 516 to connect to one or more connection pads on an electrical device. In some embodiments, one or more leads 512 may form cable 514 (e.g., a cord). Cable 514 may be attached to testing device interface 516, Generally relating to testing device interface 304 depicted in FIG. 3. As such, adapter 500, cable 514, and testing device interface 516 may form a single cohesive part such that electrical connection is maintained across adapter 500, cable 514, and testing device interface 516.

Figure 5B:
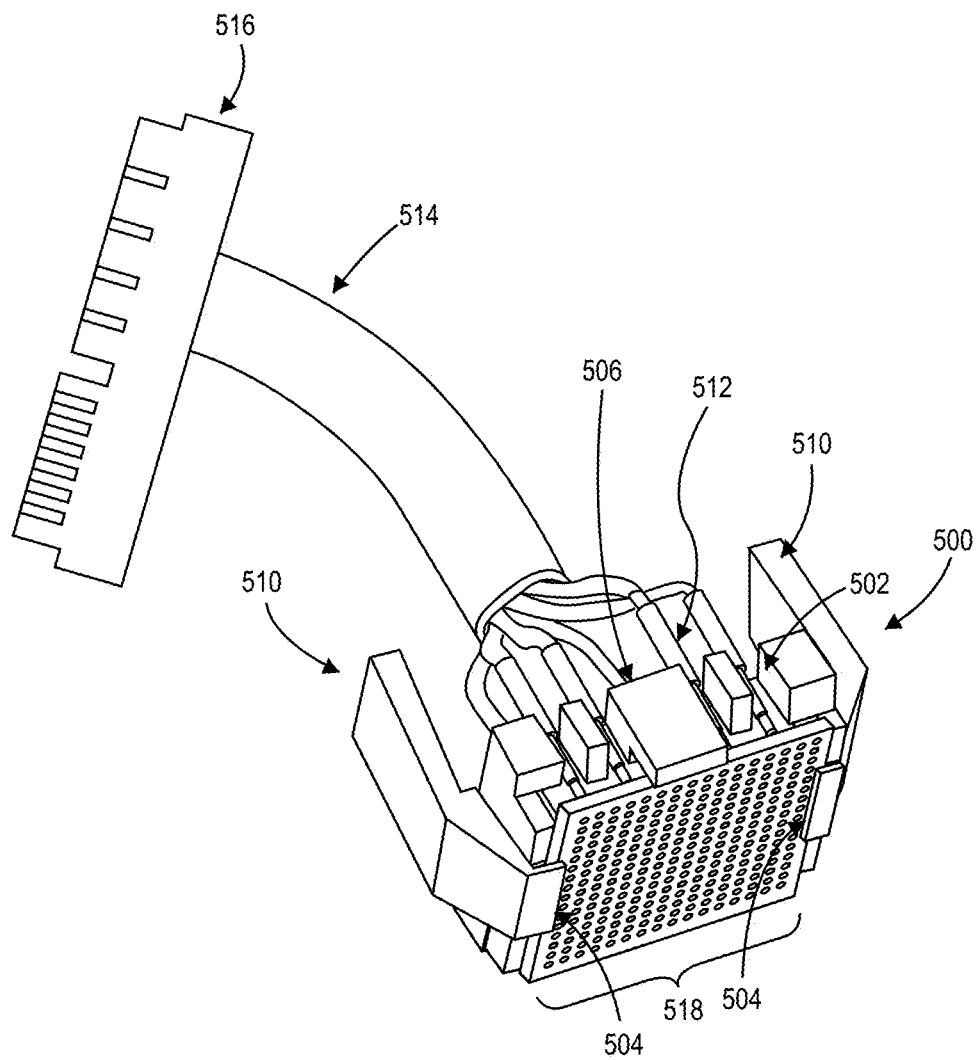
FIG. 5B depicts an exemplary testing platform adapter attached to an electrical component in accordance with embodiments of the invention.

Continuing on, an exemplary testing board adapter attached to an electrical device is depicted FIG. 5B. As discussed above with respect to adapter 400, In order to secure electrical device 518, generally corresponding to electrical device 100 and electrical device 200 discussed above, to adapter 500, one or more tabs 510 attached to one or more clips 504 may be manipulated such that one or more tabs 510 move closer to one another. Consequently, one or more clips 504 may move apart, creating a space wider than electrical device 518 such that electrical device 518 may slide into the bottom cavity. As such, when one or more tabs 510 are released and return to a neutral/rest position, the ends of one or more clips 504 may overlap the edges of electrical device 518 such that electrical device 518 remains secured to adapter 500.

In some embodiments, when in a secured position, one or more connection pads, such as one or more connection pads 110 depicted in FIGS. 1A-1B, may contact one or more leads 512 connected to testing device interface 516. The connection between one or more leads 512 and electrical device 518 may establish an electrical connection between them when power is supplied. This may facilitate the transfer of data, signals, power, and the other information.

Figure 6:
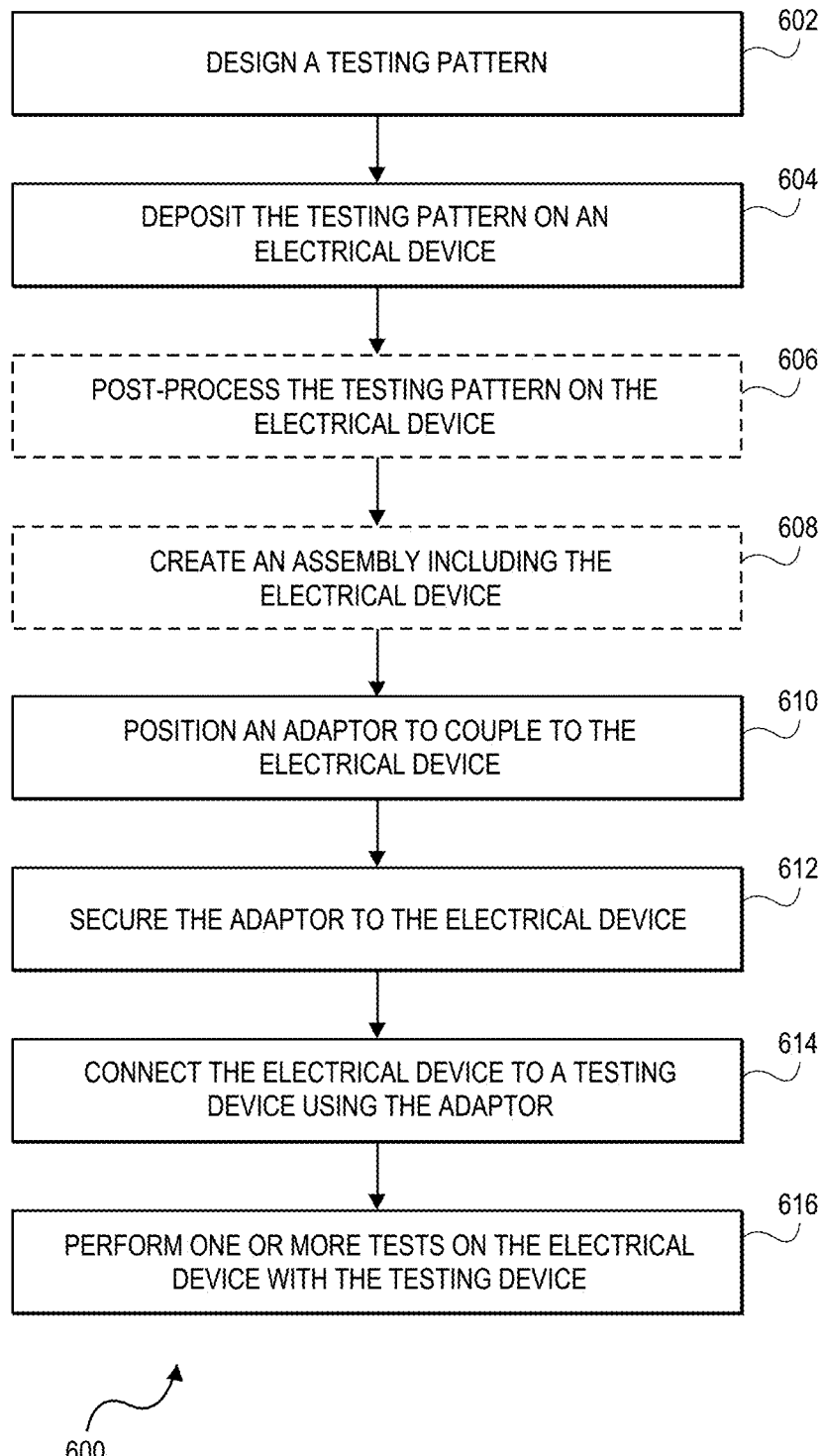
FIG. 6 depicts an exemplary flow diagram of a method for testing in accordance with embodiments of the invention.

Turning now to FIG. 6 an exemplary method for testing a printed board is depicted and generally referred to as method 600. At step 602, a testing pattern is designed. As described above with regard to FIGS. 1A-2B, the testing pattern may be designed to be usable to perform any number of tests, diagnostics, verifications, and the like. In some embodiments, the testing pattern is a sensor, such as, but not limited to, a thermocouple, strain gauge, capacitive sensor, heat sensor, flex sensor, movement sensor, or pressure sensor. In some embodiments, the testing pattern is a sticker, where the testing pattern includes an adhesive or adhesive-like mechanism to adhere to a component and/or printed board. In some embodiments, as described above, the testing pattern may be formed from one or more printed traces. The one or printed traces may be located in the leaded area on the underside of a printed board, such as between the balls of a ball grid array.

At step 604, the testing pattern is deposited on an electrical device. The testing pattern may be formed from one or more printed traces such that one or more printed traces are deposited on a component to form the testing pattern. In some embodiments, the testing pattern is formed from a conductive, metallic ink, such as a silver-based ink. In some embodiments, the testing pattern may be deposited on the component using one or more additive manufacturing systems now known or later developed, including, but not limited to, aerosol jet printing systems, 3-dimensional printing systems, inkjet systems, droplet-based systems, extrusion-based deposition systems, laser-based systems, tip-based deposition systems, additive manufacturing systems, and similar manufacturing systems.

At optional step 606, the testing pattern is post-processed on the electrical device. In some embodiments, the testing pattern is subjected to one or more post-processing techniques for any number of purposes. The testing pattern may be sintered, annealed, cured, etc. in order to ensure the integrity of the testing pattern on the electrical device. For example, the testing pattern may be sintered so as to securely attach the testing pattern to the electrical device to where it cannot be removed. Any number of post-processing steps and techniques may be performed on the testing pattern and electrical device without departing from the scope herein.

At optional step 608, an assembly including the electrical device is created. In some embodiments, the electrical device is a component of a larger system. For example, similarly to one or more components 210, depicted in FIGS. 2A-2B, the electrical device may be a component on a circuit board. As such, the electrical device may be attached to the circuit board as to create an assembly. Accordingly, the electrical device may be tested while part of an assembly, instead of independent of an assembly. This may allow for on-board testing of components without the need for an additional testing board to test various components before the components are part of their intended assemblies.

At step 610, an adapter is positioned to couple to the electrical device. In some embodiments, the adapter may facilitate the electrical connection between the electrical device and a testing device interface attached to the adapter. Further, the adapter may physically and structurally secure the electrical device to the adapter using one or more clips. The adapter may thus be positioned to couple to the electrical device, such as when the electrical device is physically secured to the adapter. For example, Electrical device 300 (as depicted in FIG. 3) may be positioned to couple to electrical device adapter 306 when electrical device 300 is located directly beneath electrical device adapter 306 (e.g., near the bottom cavity). In some embodiments, as described above with regard to FIG. 5B, the adapter may be positioned such that what are more electrical leads of a testing device interface make contact with one or more connection pads of the electrical device.

At step 612, the adapter is secured to the electrical device. As described above with regard to one or more clips 404 depicted in FIG. 5B, the adapter may be secured to an electrical device when one or more clips of the adapter come to rest over one or more edges of the electrical device. In some embodiments, the electrical device is secured to the adapter such that a physical connection is maintained between the electrical device and the adapter, and an electrical connection is maintained between the electrical device and the testing device interface.

At step 614, the electrical device is connected to a testing device using the adapter. As described above, the electrical device may be connected to a testing device using a testing device interface attached to the adapter. Accordingly, the electrical device maybe physically and or electronically connected to the testing device interface when the adapter secures the electrical device. In some embodiment, as described above, a user may put one or more clips of the adapter into an active position when the user squeezes together one or more tabs attached to the one or more clips. As such, when in the active position, the one or more clips may have a wider distance between them than the length of the electrical device such that the component may fit in the bottom cavity of the adapter. Finally, when the one or more tabs are released, the electrical device may be connected and or secured to the adapter.

At step 616, one or more tests are performed on the electrical device with the testing device. The electrical device may be tested on any number of criteria or characteristics including but not limited to cleanliness, durability, connectivity, and the like. Additionally, the electrical device may be monitored for a specific period of time for any number of criteria. To perform the tests, the testing pattern of the electrical device may be utilized. For example, during SIR testing, the testing pattern may be monitored to determine resistance between the testing pattern and adjacent electrical connections.

As described above with regard to external testing device 302, an external testing device may perform one or more tests on the electrical device. For example, the external testing device may perform SIR and/or ECM testing through the use of particular environmental chambers and computing devices. For another example, the external testing device may perform a variety of environmental tests. For still another example, the external testing device may test, monitor, or verify one or more characteristics of the electrical device.

Although the present disclosure has been described with reference to the embodiments illustrated in the attached drawing figures, it is noted that equivalents may be employed and substitutions made herein without departing from the scope of the present disclosure as recited in the claims.

Having thus described various embodiments of the present disclosure, what is claimed as new and desired to be protected by Letters Patent includes the following:

The invention claimed is:

1. A testing platform comprising:
an electrical device configured to maintain an electrical connection with an additional electrical device when the electrical device and the additional electrical device are assembled together, the electrical device comprising:
one or more leads forming a leaded area on the electrical device;
one or more connection pads located on a surface of the electrical device, the one or more connection pads establishing a secondary electrical connection between the electrical device and an external testing system; and
a testing pattern deposited on the leaded area of the electrical device, the testing pattern usable by the external testing system for testing the electrical device, the testing pattern comprising:
one or more printed traces, the one or more printed traces formed from a material deposited via an additive manufacturing technique,
wherein the one or more printed traces are located between the electrical device and the additional electrical device when the electrical device and the additional electrical device are assembled together.

2. The testing platform of claim 1, wherein the testing pattern comprises a surface-insulation resistance testing pattern and the external testing system is configured to perform a surface-insulation resistance test.

3. The testing platform of claim 1, wherein the additional electrical device comprises at least one of a printed circuit board, a printed circuit assembly, or a printed wiring board.

4. The testing platform of claim 3, wherein the electrical device comprises at least one of a ball grid array, a quad flat no-lead package, or a bottom-terminated component.

5. The testing platform of claim 1, further comprising:
an electrical device adapter, wherein the electrical device adapter is configured to lock the external testing system to the one or more connection pads to maintain the secondary electrical connection.

6. The testing platform of claim 1, wherein the testing pattern comprises a printed sensor, the printed sensor configured to measure one or more characteristics of the electrical device.

7. The testing platform of claim 1, wherein the one or more printed traces are deposited on a topside of the electrical device,
wherein the surface on which the one or more connection pads are located is a bottom side of the electrical device.

8. A method for creating testing platforms via additive manufacturing, comprising:
determining a testing pattern for a plurality of electrical devices electrically coupled together, the testing pattern comprising:
one or more printed traces, the one or more printed traces formed from a material; and
depositing, via an additive manufacturing technique, the testing pattern on at least an electrical device from the plurality of electrical devices, the electrical device comprising:
one or more connection pads configured to establish an electrical connection between the testing pattern deposited on the electrical device and an external testing system,
wherein the testing pattern is deposited in a leaded area of the electrical device;
wherein the one or more printed traces are located between the plurality of electrical devices when the plurality of electrical devices are coupled together.

9. The method of claim 8, further comprising:
depositing, on an underside of the electrical device, the one or more printed traces such that the one or more printed traces form the testing pattern.

10. The method of claim 9, wherein the testing pattern is a surface-insulation resistance testing pattern usable by the external testing system to perform surface-insulation resistance testing.

11. The method of claim 9, further comprising:
depositing the one or more connection pads on a topside of the electrical device such that the electrical connection between the electrical device and the external testing system can be established from the topside of the electrical device.

12. The method of claim 8, wherein the testing pattern is formed from an ink deposited by the additive manufacturing technique.

13. The method of claim 8, further comprising:
securing the electrical device to the external testing system via an electrical device adapter.

14. The method of claim 13, wherein securing the electrical device to the external testing system via the electrical device adapter comprises:
placing one or more leads from the external testing system in one or more lead cutouts of the electrical device adapter such that the one or more leads touch the one or more connection pads on the electrical device.

15. A testing platform, comprising:
an electrical device comprising:
one or more connection pads located on a surface of the electrical device, the one or more connection pads configured to establish an electrical connection between the electrical device and an external testing system; and
one or more leads forming a leaded area on the electrical device;
a testing pattern deposited on the leaded area of the electrical device and usable by the external testing system for testing the electrical device, the testing pattern comprising:
one or more printed traces, the one or more printed traces formed from a material deposited via an additive manufacturing technique,
wherein the one or more printed traces are located between the electrical device and an additional electrical device when the electrical device and the additional electrical device are coupled together; and
an electrical device adapter, wherein the electrical device adapter is configured to secure the external testing system to the one or more connection pads to maintain the electrical connection.

16. The testing platform of claim 15, wherein the material comprises a deposition of nanoparticles.

17. The testing platform of claim 15, wherein the electrical device adapter is configured to secure the external testing system to the one or more connection pads such that one or more leads of the external testing system maintain the electrical connection with the one or more connection pads.

18. The testing platform of claim 17, wherein the one or more connection pads wrap around to a topside of the electrical device such that the one or more leads establish the electrical connection with the one or more connection pads on the topside of the electrical device.

19. The testing platform of claim 15, wherein the electrical device adapter comprises:
a plurality of tabs configured to secure and release the electrical device to the electrical device adapter.

20. The testing platform of claim 15, wherein the testing pattern is deposited on an underside of the electrical device.

* * * * *

UNITED STATES PATENT AND TRADEMARK OFFICE
CERTIFICATE OF CORRECTION

Page 1 of 1

PATENT NO. : 12,352,804 B1
APPLICATION NO. : 18/787537
DATED : July 8, 2025
INVENTOR(S) : Hartley et al.

It is certified that error appears in the above-identified patent and that said Letters Patent is hereby corrected as shown below:

On the Title Page

Item (12) delete:
"Benjamin Hartley et al."
And insert:
-- BenjaminHartley et al. --

Item (72) should read as follows:
Inventors: Daniel BenjaminHartley, Holden, MO (US); Jaime Eduardo Regis, Overland Park, KS (US); Ryan John Eickbush, Lee's Summit, MO (US); Bill Capen, Raymore, MO (US); Jason Bradley Edgar, Potosi, MO (US)

Signed and Sealed this
Thirteenth Day of January, 2026

John A. Squires
*Director of the United States Patent and Trademark Office*